United States Patent
Mann et al.

(10) Patent No.: US 8,208,127 B2
(45) Date of Patent: Jun. 26, 2012

(54) COMBINATION STOP FOR CATOPTRIC PROJECTION ARRANGEMENT

(75) Inventors: Hans-Juergen Mann, Oberkochen (DE); Daniel Kraehmer, Essingen (DE); Aurelian Dodoc, Heidenheim (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 818 days.

(21) Appl. No.: 12/173,595

(22) Filed: Jul. 15, 2008

(65) Prior Publication Data

US 2009/0021714 A1    Jan. 22, 2009

(30) Foreign Application Priority Data

Jul. 16, 2007    (DE) .......................... 10 2007 033 054

(51) Int. Cl.
- G03B 27/72 (2006.01)
- G03B 27/54 (2006.01)
- G03B 27/42 (2006.01)
- G03B 27/58 (2006.01)

(52) U.S. Cl. .................. 355/71; 355/67; 355/53; 355/74

(58) Field of Classification Search .................... 355/53, 355/67, 71, 74
See application file for complete search history.

(56) References Cited

U.S. PATENT DOCUMENTS

| 5,627,626 | A  | * | 5/1997 | Inoue et al. | 355/67 |
| 6,239,912 | B1 | * | 5/2001 | Ozawa | 359/618 |
| 6,885,432 | B2 |   | 4/2005 | Tsuji |  |
| 2003/0007254 | A1 | * | 1/2003 | Tocci | 359/663 |
| 2003/0151728 | A1 | * | 8/2003 | Nishi | 355/30 |
| 2004/0001190 | A1 | * | 1/2004 | Tsuji | 355/53 |
| 2006/0198039 | A1 |   | 9/2006 | Sasaki |  |
| 2006/0291077 | A1 |   | 12/2006 | Shim et al. |  |

FOREIGN PATENT DOCUMENTS

| DE | 10 2006 044 591 | 4/2008 |
| EP | 1 202 291 A2 | 5/2002 |
| EP | 1 355 194 A2 | 10/2003 |
| EP | 1418467 | 5/2004 |
| EP | 1 768 172 A1 | 3/2007 |
| JP | 2004 158786 | 6/2004 |
| WO | WO 2004/046771 | 6/2004 |
| WO | WO 2006/128613 | 12/2006 |

* cited by examiner

*Primary Examiner* — Edward Glick
*Assistant Examiner* — Deoram Persaud
(74) *Attorney, Agent, or Firm* — Fish & Richardson P.C.

(57) ABSTRACT

The disclosure relates to an optical projection arrangement that can be used to image a reticle onto a substrate. The projection arrangement includes reflective elements, by which a ray path is defined. A combination stop is in a pupil of the ray path. The combination stop has a first opening (aperture opening) for use as an aperture stop. The combination stop also has a second opening for allowing passage of a ray bundle of the ray path, such that the combination stop acts as a combined aperture stop and stray light stop. In addition, the disclosure relates to a corresponding combination stop for optical arrangements, as well as related systems, components and methods.

35 Claims, 5 Drawing Sheets

COMBINATION STOP FOR CATOPTRIC PROJECTION ARRANGEMENT

CROSS-REFERENCE TO RELATED APPLICATION

This application claims priority under 35 U.S.C. §119 to German patent application DE 2007 033 054.7, filed Jul. 16, 2007, the entire contents of which are hereby incorporated by reference.

FIELD

The disclosure relates to an optical projection arrangement that can be used to image a reticle onto a substrate. The projection arrangement includes reflective elements, by which a ray path is defined. A combination stop is in a pupil of the ray path. The combination stop has a first opening (aperture opening) for use as an aperture stop. The combination stop also has a second opening for allowing passage of a ray bundle of the ray path, such that the combination stop acts as a combined aperture stop and stray light stop. In addition, the disclosure relates to a corresponding combination stop for optical arrangements, as well as related systems, components and methods.

BACKGROUND

Microlithography with extreme ultraviolet light, so-called EUV lithography (EUVL), in which wavelengths of electromagnetic radiation of around 13 nm are employed, generally uses imaging arrangements having purely reflective optical elements (catoptric systems). Typically, in corresponding EUVL projection exposure systems, both the illumination unit, which uniformly illuminates a reflective mask (reticle), and the optical projection arrangement for imaging the structures of the reticle in a reduced image onto a wafer coated with a photosensitive material, have mirror arrangements.

SUMMARY

In some embodiments, the disclosure provides an optical projection arrangement with a plurality of reflective elements that can facilitate flexible use of the optical projection arrangement in a simple and effective way. The optical projection arrangement can provide good imaging properties.

In certain embodiments, the projection arrangement images at least part of a reticle that is positioned in an object field of an object plane onto a wafer that is positioned in an image field of an image plane. The projection arrangement includes an exchangeable combination stop, which has at least one aperture opening (first opening) for the passage of a ray bundle in a pupil plane of the ray path and at least a second opening (e.g., a third opening or several openings) for the passage of adjacent ray bundles. The stops created by the second and/or third openings are termed field stops. Positioning of the combination stop can occur with the stop plane (principal surface) transverse (e.g., perpendicular) to a meridional plane defined by the object field and the projection arrangement, and the movement for exchanging the corresponding combination stop can be performed transversely (e.g., perpendicularly) to the meridional plane. In some embodiments, the positioning can occur at an angle in the range of 80° to 100° (e.g., 85° to 95°) to the meridional plane.

The second and/or third and every further opening for allowing passage of adjacent ray bundles in the meridional plane can be given a certain minimum size in spite of cramped space conditions, so the possibility is created of simultaneously achieving adequate obscuration of stray light and flexibility for different imaging parameters and/or for designs of the arrangement. Generally, the openings are as small as desired for shielding of stray light and as wide as possible for ray path design. In some embodiments, the second and/or third opening and/or each further opening for adjacent ray bundles in the meridional plane can have an opening width of $\geqq 10$ mm (e.g., $\geqq 20$ mm, $\geqq 40$ mm). In certain embodiments, the diameter of the opening width of the aperture stop may be in the range of 70 to 200 mm (e.g., 80 to 150 mm, 100 to 110 mm). This can be the case, for example, for EUV systems having a numerical aperture NA of 0.25 to 0.6 at the wafer side.

The second or third opening or further openings for adjacent ray bundles correspond to each other in their mode of action and can therefore have similar properties. Optionally, the second and third opening can be configured in point-symmetrical fashion about the center of the first opening (aperture opening).

For simple replacement of the combination stop, a device for moving the combination stop can be provided, which facilitates exchange via a rotary movement and/or translational movement or combined movements. In some embodiments, the plane of the movement can be the plane perpendicular to the meridional plane. This movement plane can be advantageous for the design and the configuration of a corresponding catoptric projection arrangement, with allowance for all boundary conditions for the configuration and arrangement of the reflective elements and the housing and movement device, as well as with regard to the simplicity of the movement, etc.

Optionally, the combination stop can be pushed in the direction of the ray path by the corresponding device for moving the combination stop. This can be advantageous for the purpose of adjustment to the imaging properties. In this regard, the movement can occur parallel to the optical axis, such that at least a vectorial movement component occurs in the direction of the ray path.

In certain embodiments, for which protection is sought independently and in connection with the other aspects of the disclosure, a projection arrangement has a combination stop with a first opening, which acts as aperture stop, and a second opening, which serves as stray light stop or field stop, wherein the second opening extends transversely to the optical axis and, in accordance with a Cartesian coordinate system, has a maximum longitudinal extension and a minimum extension, wherein the combination stop is constructed such that the at least one first opening is provided only along a first direction (longitudinal direction) of the combination stop transverse to the direction of the maximum length of the second opening or parallel to the direction of the minimum width of the second opening. This can yield an elongated structure of the combination stop, which is very advantageous for using the combination stop in catoptric projection arrangements of microlithography because the installation space is small. In such optical arrangements, the object field to be imaged is formed as an elongated strip or as a narrow ring segment. Forming the combination stop as an elongated plate in the direction of the short extension of the field stop opening or the second opening, enables the combination stop or segments thereof to be exchanged by simple (e.g., translational movements) without the need for a large installation space. Moreover, such a design involves little installation space overall for the arrangement. This also applies in the arrangement of further first and/or second or third openings on the combination stop, which are correspondingly arranged along the longitudinal direction.

In some embodiments, a combination stop can be chosen such that corresponding first or second openings are each provided only along a second direction (width direction) of the combination stop parallel to the direction of the maximum length of a second opening or transverse to the direction of the minimum width of a second opening. In this case, the outcome is a row of only second openings and/or a row of only first openings, such that, again, an elongated shape of the combination stop is achieved, but this time in the width direction, i.e. in the direction of the maximum length of the second openings.

Overall, therefore, an arrangement of first and second or third openings along a row, or of first openings and second openings in one row each, can allow the combination stop to be correspondingly rectangular, which is ideal for the purpose of using the combination stop in the projection optics of a projection exposure system for microlithography and the space conditions prevailing there, since corresponding installation space can be saved and more flexible use is possible.

The openings can be arranged along the longitudinal direction or the width direction of the combination stop such that the centers of gravity of the cross-sections of the openings are in a straight line.

A stop can be dimensioned such that the width of the combination stop transverse to the longitudinal direction is less than 1.5 times (e.g., less than 1.2 times, less than 1.1 times) the diameter of the largest first opening or the largest maximum length of a second opening. The combination stop can involve little installation space in a direction transverse to the longitudinal direction, i.e. laterally. Thus, violation of the adjacent ray path can be avoided and the installation space of the optical arrangement can be kept small overall. Moreover, through corresponding lateral movement of the combination stop or parts thereof, that is, in the width direction of the combination stop, exchanging of corresponding stop parts can proceed more simply and favourably. Again, little installation space may be involved. The same applies to a movement of the combination stop in the longitudinal direction.

An arrangement of the first openings in a row in the width direction of the combination stop and/or an arrangement of the second openings also in a row in the width direction of the combination stop involves only a small installation height in the longitudinal direction of the combination stop, which, for example, is defined only by the diameter of a first opening and the minimum opening width of a second opening and of a corresponding distance between first and second opening and a surrounding frame for the purpose of stabilisation. For example, the dimension of 1.5 times the sum of the diameter of the first opening and the opening width of the second opening(s) in the longitudinal direction of the combination stop can be sufficient here. In this way, the combination stop involves little installation space yet simultaneously allows an advantageous exchange of stops for adjustment of the imaging conditions through simple translational movements along the longitudinal direction or the width direction. Exchanging of the stops can be carried out in such a manner that a plurality of different stop openings is provided on a stop plate, the openings being arranged correspondingly in rows, such that a simple pushing movement brings the different stop openings into position. In addition or alternatively, it is also possible to provide several corresponding combination stops for exchanging.

In some embodiments (e.g., for which protection is sought independently and in connection with the other aspects of the disclosure), it is possible to arrange several different combination stops or parts thereof for the purpose of quick exchange in a magazine within the projection arrangement or in the vicinity of the projection arrangement in order that a further adjustment to various imaging conditions may be facilitated.

A magazine with a plurality of combination stops can facilitate exchange of the combination stops via an exchange mechanism. This ensures that combination stops with different openings (e.g., different opening cross-sections, shapes and sizes) are present, which can be introduced into the ray path for the purpose of adjustment to the imaging conditions.

The plurality of the different combination stops can be designed such that combination stops of different opening cross-sections of the aperture stops are provided for, wherein the stray light stops or field stops additionally integrated into the combination stop (second or third openings) are also reduced in accordance with the reduced aperture stops, or are also enlarged in the case of enlarged aperture stops or are kept constantly unchanged irrespective of the change in the aperture stops relative to their opening cross-section.

A further advantage for the effective operation of such a projection arrangement and the flexibility can be gained by a combination stop having a segmental design, such that only parts of the combination stop have to be exchanged. This also has the advantage that a smaller number of combination stop components need only be held in stock. In this regard, the segmentation may occur separately into different classes, more precisely the class of aperture segments on one hand and the class of other segments or field segments on the other. The class of aperture segments contains the segments with the aperture opening (first opening), while the other segments are contained in the other class. Separation of the classes simplifies exchange.

Correspondingly, the segments of the combination stop can also be separately moved and exchanged by the device for moving the combination stop. The aperture stop part (aperture segment) can be separately and independently exchangeable, such that the field segments, which mostly do not need changing, can remain in the projection arrangement when an aperture segment is exchanged.

Optionally, the combination stops or segments thereof can have a rectangular or quadratic structure in a plan view of the largest side (principal surface).

The combination stop provided in the projection arrangement can be configured for a catoptric projection arrangement with several mirrors, for example six mirrors, such that the minimum distance between a first opening and a second opening is at most 5 mm (e.g., at most 3 mm, at most 1 mm). This can be advantageous for catoptric projection arrangements with ray paths moving past each other in very close proximity.

As a result of the overall small dimensioning of the combination stop, the thickness of the combination stop, i.e. the dimension perpendicular to the length and width direction, can be kept small, too, a fact which in turn offers benefits in terms of the installation space, as a thinner combination stop can be provided at more sites of the projection arrangement than a thick combination stop. By virtue of the small overall size, however, sufficient stability of the combination stop in the case of lower thickness, such as a thickness less than one fiftieth of the diameter of the largest first opening, can be achieved. Optionally, the thickness of the combination stop can be chosen so as to be less than hundredth of the diameter of the largest first opening.

On account of its small dimensions, the combination stop is capable of movement (e.g., translational movement) both in the longitudinal and in the width direction as, due to the small dimensioning, conflict with the rest of the ray path can largely be avoided, such that a translational movement is possible both in the longitudinal direction and transverse to it. In this way, by a simple pushing movement, several aperture stops arranged side by side along a longitudinal direction or, for example, a straight line can be brought simply into use or in the case of a segmented design, for example, individual aperture parts can be simply exchanged. A swivelling movement about a rotary axis is also readily possible due to the small dimensioning of the inventive combination stop, since, here, too, conflicts or collisions with other components of the projection arrangement or the ray path are more easily avoided.

Accordingly, the combination stop can be dimensioned so small as to ensure that, in at least one direction transverse to the optical axis, it has at most one third of the maximum or minimum extension of the envelope of the projection arrangement transverse to the optical axis. By envelope here is meant the at least mental accommodation of the projection arrangement in a square similar to a housing. The combination stop can be chosen so small as to ensure that the combination stop in at least one direction transverse to the optical axis has at most one fourth (e.g., at most one fifth) of the maximum or minimum extension of the envelope of the projection arrangement transverse to the optical axis.

In a corresponding catoptric projection arrangement, at least one other stray light stop in addition to the combination stop can be provided, which can be of designed to be movable together with the combination stop for the purpose of effective configuration of the projection arrangement. A further stray light stop can be arranged in a field plane or an intermediate image plane or in a nearby area to one of these planes.

For common movement of combination stop and further stray light stop, these can be joined together physically (e.g., rigidly jointed, articulatedly joined).

A further advantage can be derived from the combination stop if obscuration mechanisms and/or other optically operative elements, such as apodisation filters, phase filters, optically polarizing elements, etc. are provided in the area of the first opening (aperture opening) in the combination stop. Via obscuration in the pupil (pupil filtering), for example, through a disc or a ring, part of the zeroth order diffraction of an object to be imaged can be obscured, and thus the contrast and/or the depth of field of the imaging can be improved.

In certain embodiments, the combination stop can be part of a housing (e.g., a vacuum housing) which is provided inside the projection arrangement to create advantageous vacuum conditions. This is described in detail in DE 10 2006 044 591 and is hereby incorporated herein by reference in its entirety.

The combination stop and/or a magazine for this can be arranged inside a housing (e.g., a vacuum chamber) or outside of it.

In certain embodiments (e.g., for which protection is sought independently of the other aspects and in connection with them), a combination stop for an optical arrangement is claimed, which has at least a first opening for use as aperture stop and at least a second opening for use as field stop, wherein the at least one second opening has an extension, such that, in two mutually perpendicular directions, such as in a Cartesian coordinate system, a maximum length and a minimum width of the second opening is given, wherein the at least one first opening or further second openings are arranged only along the longitudinal direction of the combination stop transverse to the direction of maximum length or parallel to the direction of the minimum width of the second opening. Such a combination stop can be used for projection exposure systems for microlithography and there, as described above, for projection arrangements or projection optics.

BRIEF DESCRIPTION OF THE FIGURES

Further advantages, characteristics and features of the disclosure are apparent from the following detailed description using the enclosed drawings. The drawings show in purely schematic form in which.

DETAILED DESCRIPTION

Figure 1:
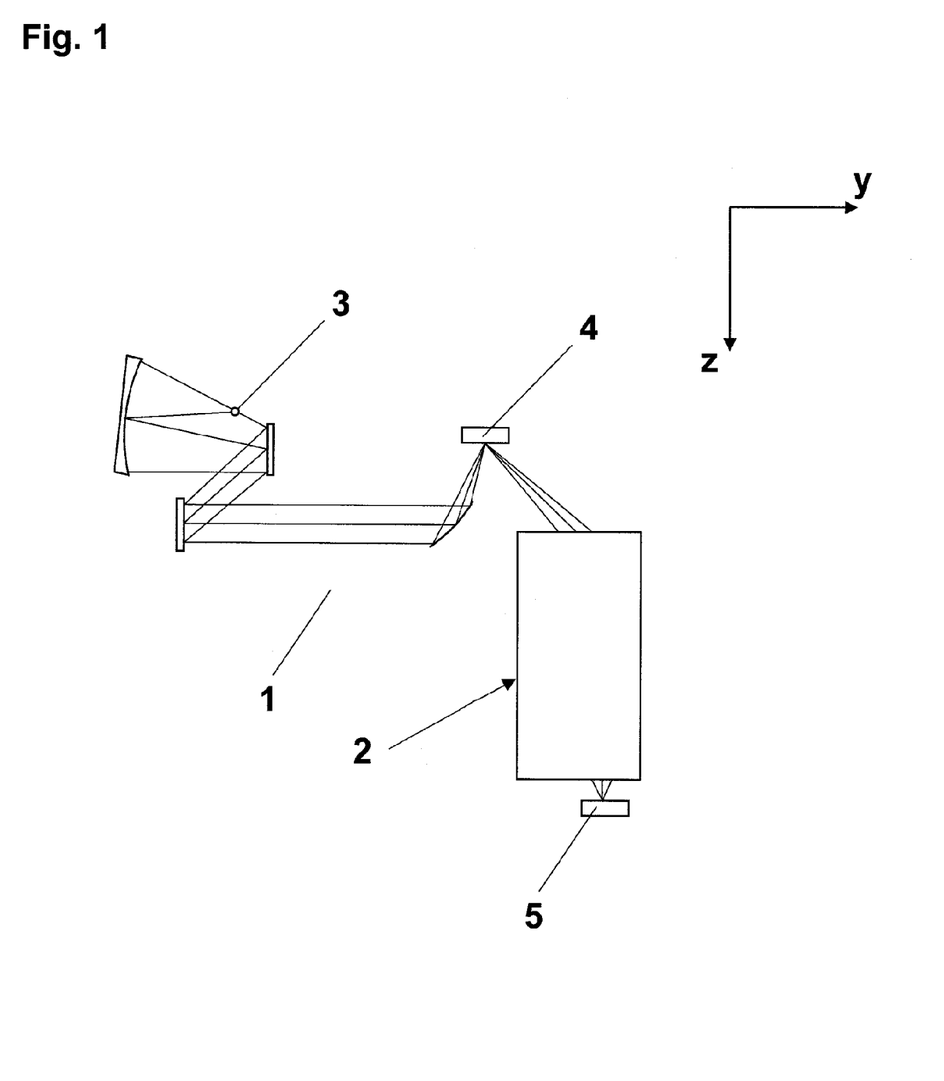
FIG. 1 is an illustration of a EUVL projection exposure apparatus with an illumination system and projection optics.

FIG. 1 is a purely schematic illustration of the principle structure of a catoptric projection exposure system for EUVL micro-lithography including an illumination system 1 and projection optics 2. Inside the illumination system, the light of a light source 3 in the wavelength range of extreme ultraviolet radiation is deflected by several mirrors or reflective elements onto a reticle 4, whose structure is to be imaged in reduced form onto a wafer 5 coated with a photosensitive layer via the projection optics 2.

Figure 2:
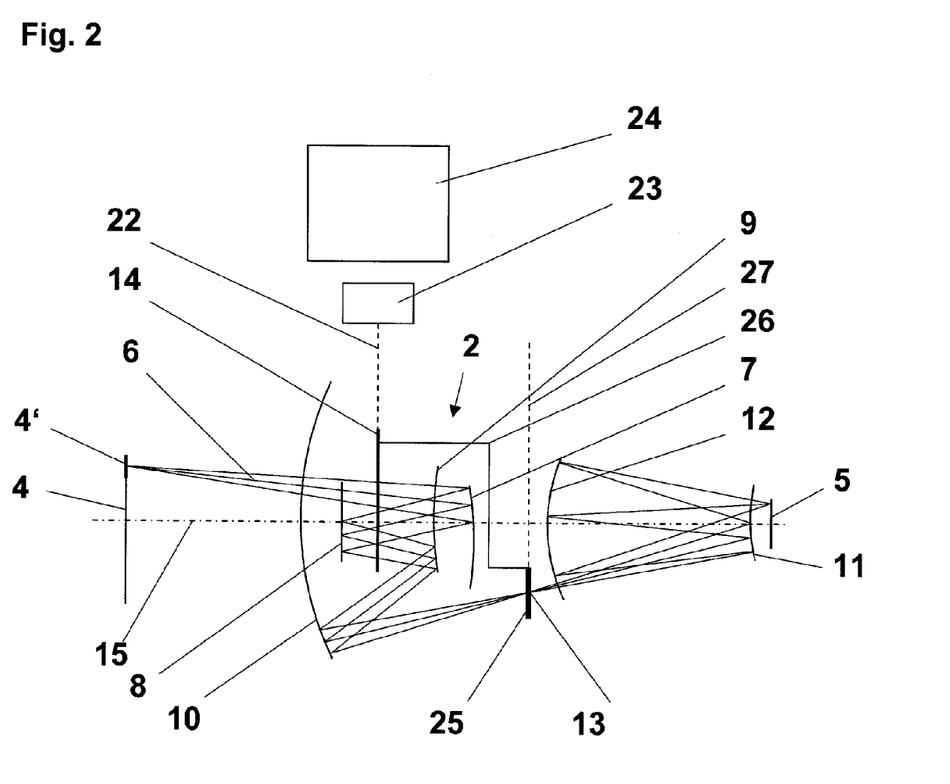
FIG. 2 is an illustration of the projection optics, such as can find application with the projection exposure apparatus from FIG. 1.

Shown in FIG. 2, also, is a purely schematic illustration of the structure of a catoptric projection optics which can be used in the projection exposure apparatus in accordance with FIG. 1.

Shown on the left side of FIG. 2, in turn, is the reticle 4, which reflects the radiation directed onto reticle 4 via illumination system 1, the radiation also capable of being called light and generally including electromagnetic radiation. The reflected radiation 6 is directed to a first mirror 7, from where the radiation 6 proceeds to a second mirror 8. After further reflections at a third mirror 9 and a fourth mirror 10, the light is finally directed via the fifth mirror 11 and sixth mirror 12 onto the wafer 5, where it images the structure of the reticle 4 on a reduced scale.

Figure 3:
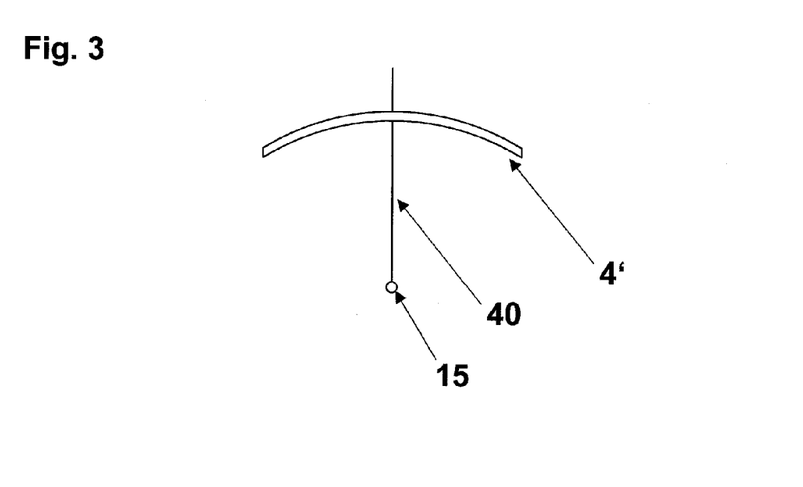
FIG. 3 is a partial view of the projection optics from FIG. 2 rotated through 90° in the direction of the optical axis.

FIG. 3, a view of the projection optics of FIG. 2 rotated through 90°, shows a meridional plane 40, as defined by the projection optics of FIG. 2 and the object field 4'. The meridional plane 40 is covered by the optical axis 15 and a principal beam proceeding from a point of the object field 4' at a distance from the optical axis 15. Accordingly, for a given object field 4', which is scanned, for example, over the reticle 4, there is a plurality of meridional planes 40, more precisely for each point of the object field 4'.

In the example shown, the ray path 6 of FIG. 2 has an intermediate image at the point labelled 13 and a pupil plane between the first mirror 7 and the second mirror 8.

In the pupil plane is provided a combination stop 14, which can be moved along the path 22 into and out of the ray path via a drive mechanism 23. The direction of movement can be along the dotted line 22 or perpendicular to the plane of the page. The combination stop 14 is essentially arranged in the pupil plane, but can also be provided in an area in front of or behind the pupil plane. Pushing of the combination stop along the optical axis 15 or in the direction of the ray path 6 can be facilitated via the drive and movement mechanism 23.

The combination 14 stop has a combined function, namely, on one hand the function of an aperture stop for the ray bundle, which proceeds from the first mirror 7 through the pupil plane to the second mirror 8. Since the ray path 6 of the chosen optical arrangement is such that the aperture stop can be formed only so as to be very small and thus stray light might not be reliably removed from the ray path, the aperture stop is formed as a combination stop, which, by virtue of its greater dimensions, can keep portions of stray light out of the ray path. However, in order that the ray path 6 may not be impaired, i.e., that the ray bundle from the reticle 4 to the first mirror 7 or from the second mirror 8 to the third mirror 9 may not be blocked, provision is made, as shown in more detail in FIGS. 3 and 4, for an additional second opening 17 and a third opening 18 for the corresponding ray bundles in the combination stop in addition to the first opening (aperture opening) 16.

The combination stop 14 is arranged perpendicularly to a meridional plane and may be moved, perpendicularly to the meridional plane, into or out of the ray path. The meridional plane is covered by the principal ray, which goes from the first mirror 7 through the center of the aperture opening of the combination stop 14, and the optical axis 15. In the example in FIG. 2, the meridional plane is given by the plane of the drawing. Alternatively, because of the small dimension of the combination stop, movement of the combination stop with the direction of movement in the meridional plane is also possible.

Figure 4:
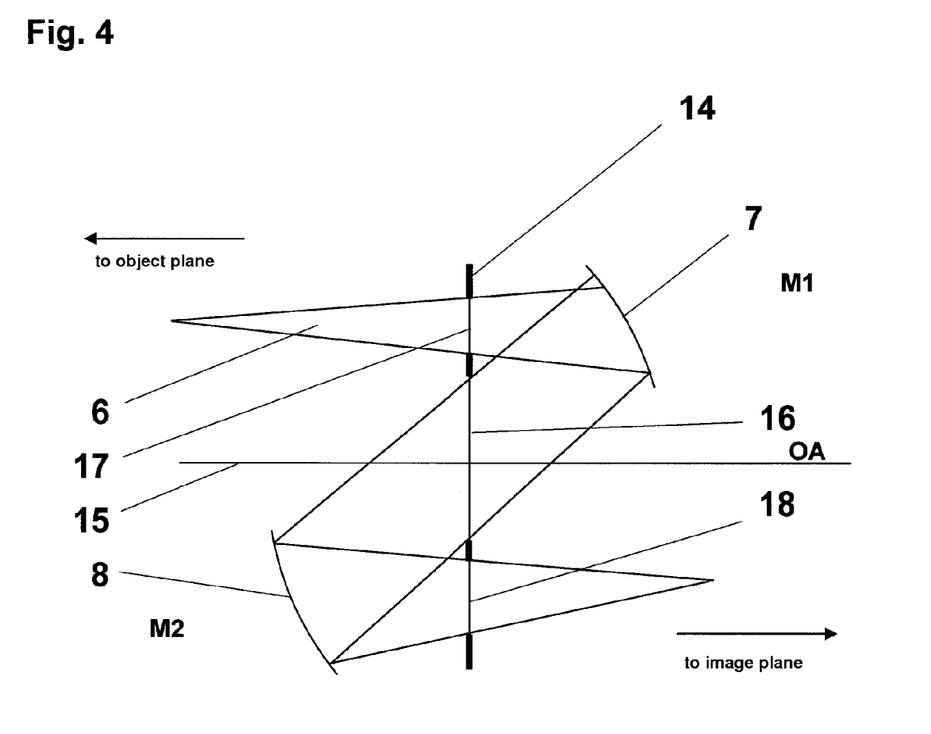
FIG. 4 is a detailed illustration from FIG. 2.
Figure 5:
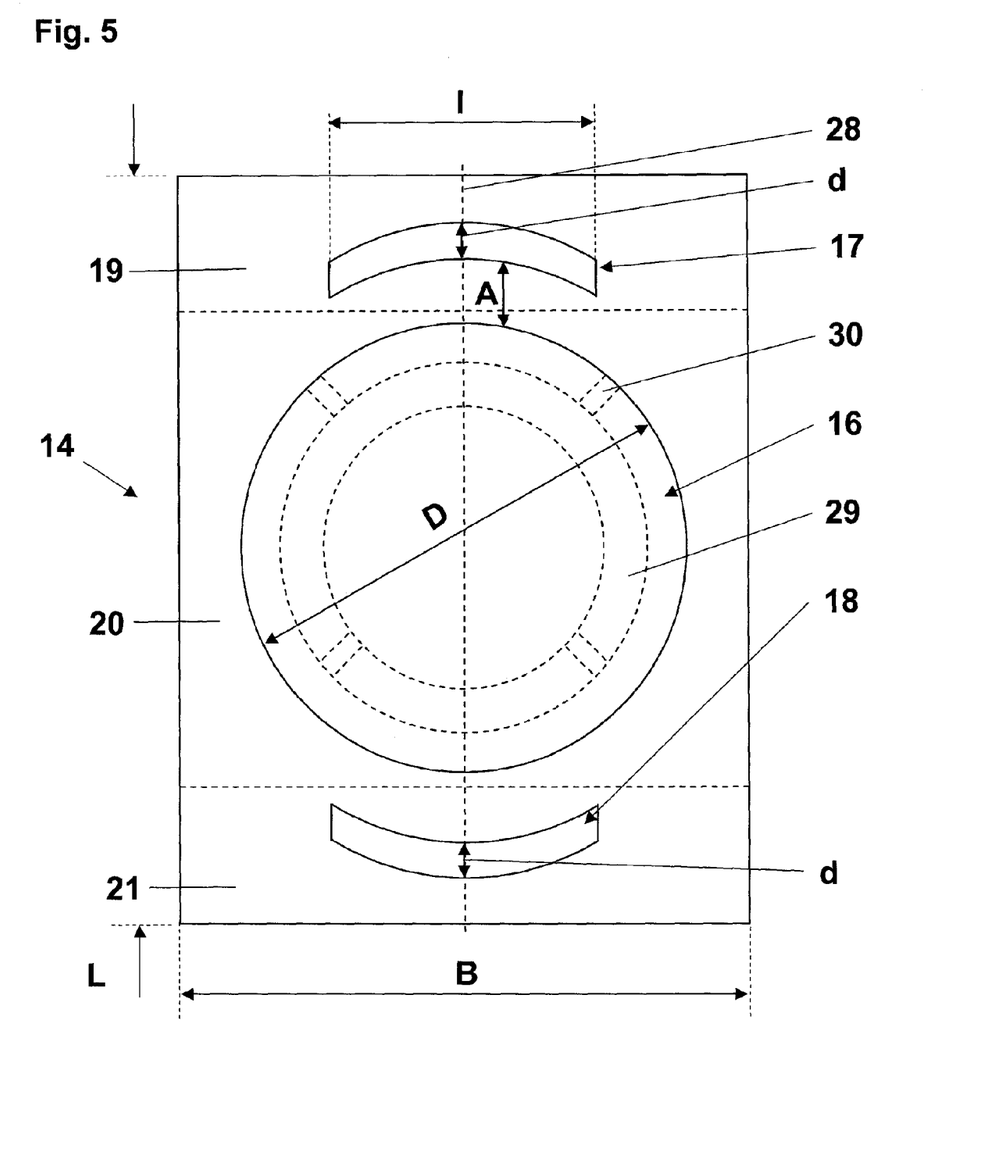
FIG. 5 is a side view of a combination stop.

The combination stop 14, shown in FIGS. 4 and 5 as side views from viewing angles rotated through 90°, has with regard to the arcuate second and third openings 17 and 18 in the meridional plane 28 an opening width d, which is $\geq 10$ mm (e.g., $\geq 20$ mm, $\geq 40$ mm). Through the corresponding arrangement of the combination stop 14 in the ray path of a catoptric optical system 2 and the choice of the size of the openings for adjacent ray bundles, flexible use of the combination stop and flexible operation of the optical system combined with good shielding behaviour for the stray light are facilitated. As a result, not so many different combination stops need to be kept in stock for different imaging conditions.

Due to the small dimensioning of the combination stop 14, such as that shown in FIG. 5, there is manifold scope for arrangement and exchange.

As can be seen in FIG. 5, the combination stop 14 can, in plan view, be designed as a rectangular or quadratic stop element, wherein the first opening 16 and the second opening 17 and the third opening 18 are arranged in a row, which extends along the longitudinal direction. The longitudinal direction here is defined as the direction transverse to the maximum extension of the second opening 17 or parallel to the direction of the minimal extension of the second opening 17. In FIG. 5, the minimum extension of the second opening 17 is given by the opening width d, while the maximum length of the second opening 17 is labelled with the letter l.

The width B of the combination stop 14 can be defined by a multiple of the diameter D of the first opening 16, while the length L of the combination stop 14 is predefined by the diameter D of the first opening and the opening widths d of the second opening 17 and the third opening 18. Since the distance A between the first opening 16 and the second opening 17 or between the first opening 16 and the third opening 18 can be chosen so as to be very small, for example, less than 5 mm (e.g., less than 3 mm, less than 1 mm) the total length L of the combination stop 14 can be just slightly greater than the sum of the diameter D of the first opening 16 and the opening width(s) d of the first and/or second and/or third openings 17, 18, for example, 1.5 times (e.g., 1.3 times, 1.1 times).

In addition, the combination stop 14, as shown in FIG. 5, can have a segmented structure, such that the aperture can be subdivided into the segments 19, 20 and 21. The subdivision quoted, indicated by the dotted lines, is not the only possibility, however, and manifold types of segmentation are possible. This means that the entire combination stop 14 need not be removed from the ray path every time, but that, when a part is being exchanged, such as the segment 19 with the second opening 17, just this part can be exchanged. Moreover, this design allows a different composition of stop parts, such that fewer stop components need to be kept in stock despite the greater flexibility.

The segments are formed such that they can be interconnected so as to support and stabilise each other in the arrangement in the projection optics or an optical arrangement generally. For example, the connecting elements may be formed by rail arrangements and the like such that the individual segments can be easily exchanged and may be readily moved towards each other.

A corresponding drive and movement mechanism 23, as shown in FIG. 2, is provided for the exchange of the combination stop 14 or any part thereof. In connection with the drive and movement mechanism 23, a magazine 24 is provided in which a plurality of combination stops 14 with different first openings 16 and second and third openings 17 and 18 and corresponding combination stop segments 19, 20, 21 are stored and kept available.

Accordingly, the drive and movement mechanism 23 can move the combination stop 14 or any part thereof on the movement plane 22 so that the combination stop 14 overall or any part thereof may be exchanged. The corresponding movement can be translational or take the form of a rotary movement or combinations thereof.

As shown in FIG. 2, a second stray light stop 25 can be used in the design of the catoptric projection optics, the stop 25 being provided in or near the intermediate image plane 13. The stray light stop 25 can also be moved into or out of the ray path by a movement on a movement plane 27, optionally with movements similar to the combination stop. This can be done via the same drive and movement device 23 also responsible for the movement of the combination stop 14. To this end, a coupling 26 is provided between the combination stop 14 and the second stray light stop 25, which may be formed either rigidly or have corresponding kinematics with articulated joints and the like for optimising the movement. Through the common movement of the combination stop 14 and the stray light stop 25, a simplified possibility of introducing and removing corresponding stops is created in the cramped space conditions given in such an optical system.

For the stray light stops, too, different stops may be held in a magazine (not shown).

In FIG. 5 furthermore, the first opening (aperture opening) 16 contains an optional obscuration ring, shown in dotted lines, which is held in the first opening 16 by corresponding elements 30. Via the ring, some of the light, which would pass through the first opening (aperture opening) 16 can be obscured in order that the contrast and/or depth of field area of the imaging may be increased. Instead of a ring 29, a disc or the like may also be provided or a phase filter or a optically polarising element (retarder, polarizer, etc.) or another optically operative element.

Figure 6:
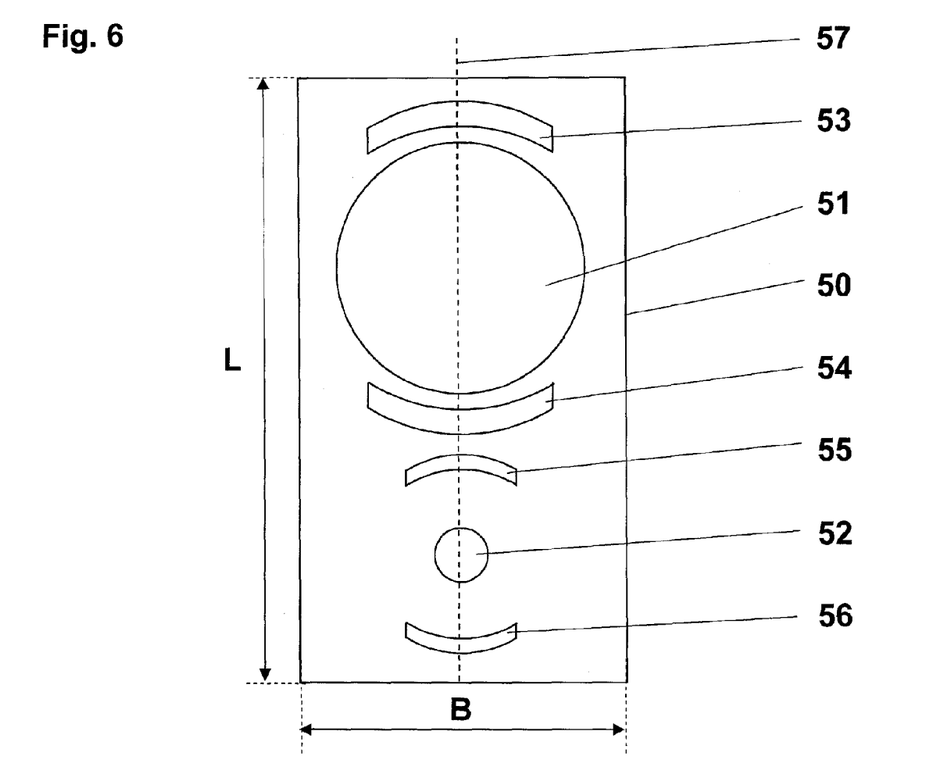
FIG. 6 is a side view of a combination stop.
Figure 7:
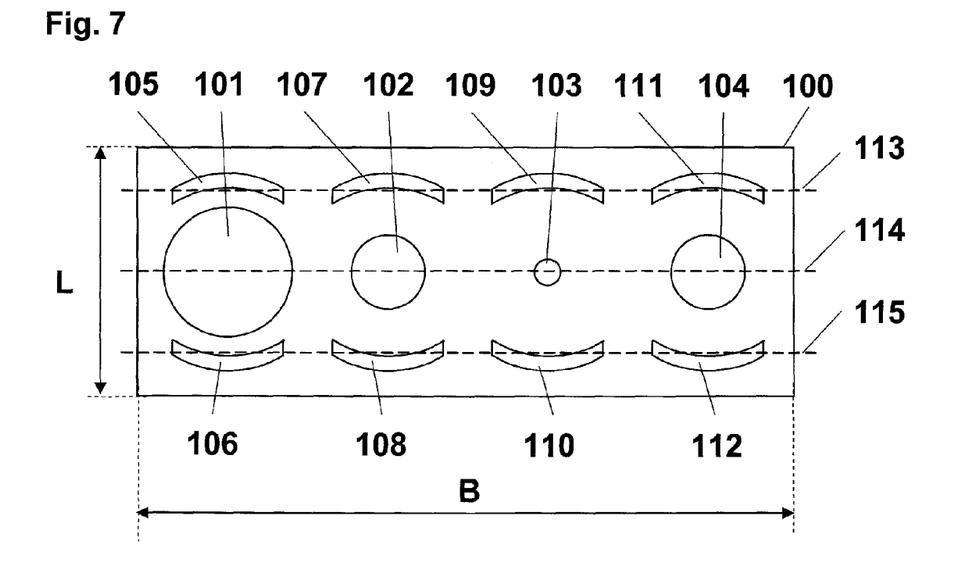
FIG. 7 is a side view of a combination stop.

FIGS. 6 and 7 show two further examples in a plan view similar to that of FIG. 5.

FIG. 6 shows a quadratic or, in plan view, rectangular combination stop 50, which includes the two first openings 51 and 52 as aperture stops and a total of four second openings 53, 54, 55, 56 as stray light stops or field stops. The stop openings 51, 53 and 54 represent one unit, which can be used at the same time in the ray path of a projection arrangement, while the stop openings 52, 55 and 56 represent a second unit, which can be provided by way of alternative to the first unit in the ray path of a projection arrangement. The combination stop 50 is formed such that the centers of the corresponding openings 51 to 56 are arranged along a straight line 57, such that a simple pushing movement of the combination stop 50 along the longitudinal direction L can effect an exchange of the stops.

FIG. 7 shows in an illustration similar to FIG. 6 a combination stop 100 in which overall four stop units each with three stop openings are provided, more precisely each with a first opening 101, 102, 103, 104 and each with two second openings 105, 106; 107, 108, 109; 110 and 111, 112. The combination stop 100, which is also rectangular in the plan view, is formed however such that in each case the first openings 101 to 104 are arranged along a straight line 114, while the respective second openings 105 to 112 are also arranged along two straight lines 113 and 115. While the combination stop 50 of FIG. 6 can be moved along the longitudinal direction L in order that the differently formed stop units may be moved into the ray path, the combination stop 100 can bring the different stop units into operation by a push along the width direction B.

Whereas, in FIG. 6, the second stop unit differs not only in that the first openings 51 and 52 are of different size, that is, are formed with a different diameter D, but that additionally the second stop openings 53, 54, 55, 56 are of different size, in the case of combination stop 100 of FIG. 7, merely a variant of the first openings 101 to 104 is provided, while the second openings have the same order of magnitude.

In a segmented configuration of the combination stop 100, in which, for example, the second openings 105, 107, 109 and 111 are arranged on one segment, the first openings 101 to 104 are arranged on a second segment and the second openings 106, 108, 110 and 112 are arranged on a third segment, it is also conceivable for the segments with the second openings to each have only one second opening, which is then accordingly pushed with the segment of the first opening or this is arranged stationary in the projection arrangement and only the segment with the first openings is designed such that it can be pushed.

Although the disclosure has been described in detail for some embodiments using the attached drawings, the disclosure is not restricted to these embodiments. Modifications, such as different combinations of individual features as well as the exclusion of certain features, are possible without departing from the scope of the accompanying claims.

What is claimed is:

1. A projection arrangement configured to image an object field in an object plane onto an image field in an image plane along a ray path, the projection arrangement comprising:
   first, second, and third reflective elements;
   a combination stop positioned at a pupil plane of the ray path, the combination stop having first, second, and third openings, the first opening in the combination stop being configured as an aperture stop, the second opening in the combination stop being configured to allow passage of a ray bundle of the ray path so that the combination stop is an aperture stop and a stray light stop;
   a reticle; and
   a device configured to move the combination stop transversely to a meridional plane defined by the projection arrangement and the object field,
   wherein:
   the combination stop is between the reticle and the first reflective element;
   the combination stop is between the first reflective element and the second reflective element;
   the first opening in the combination stop is configured to allow passage of the ray bundle from the first reflective element to the second reflective element;
   the second opening in the combination stop is configured to allow passage of the ray bundle between the reticle and first reflective element;
   the third opening in the combination stop is configured to allow passage of the ray bundle from the second reflective element to the third reflective element; and
   the projection arrangement is a microlithography projection arrangement.

2. The projection arrangement in accordance with claim 1, wherein the second opening in the combination stop is within the meridional plane and is greater than or equal to 10 mm.

3. The projection arrangement in accordance with claim 1, wherein the third opening in the combination stop is within the meridional plane and is greater than or equal to 10 mm.

4. The projection arrangement in accordance with claim 1, wherein the second and third openings in the combination stop are arranged point-symmetrically to the center of the first opening.

5. The projection arrangement in accordance with claim 1, wherein the device is configured to facilitate at least one movement selected from the group consisting of rotary movement of the combination stop in a plane perpendicular to the meridional plane and translational movement of the combination stop in a plane perpendicular to the meridional plane.

6. The projection arrangement in accordance with claim 1, further comprising a magazine and a plurality of combination stops each of which differ in at least one opening size, the plurality of combination stops being in the magazine.

7. The projection arrangement in accordance with claim 1, wherein the combination stop has a segmented design.

8. The projection arrangement in accordance with claim 7, wherein the segments of the combination stop can be moved separately by a device to move the combination stop.

9. The projection arrangement in accordance with claim 7, wherein, for a given combination stop, the aperture stop can be exchanged separately from the stray light stop.

10. The projection arrangement in accordance with claim 1, wherein the combination stop or parts thereof are formed as a rectangular or quadratic plate in a plan view of a principal surface.

11. The projection arrangement in accordance with claim 1, wherein a minimum distance between the first opening in the combination stop and the second opening in the combination stop is at most 5 mm.

12. The projection arrangement in accordance with claim 1, wherein a thickness of the combination stop is less than one 50th of a diameter of the first opening.

13. The projection arrangement in accordance with claim 1, wherein the combination stop can be moved in at least one way selected from the group consisting of movement along a longitudinal direction of the combination stop, movement along a width direction of the combination stop and swiveling about a rotary axis.

14. The projection arrangement in accordance with claim 1, wherein the combination stop in at least one direction transverse to an optical axis of the projection arrangement has at most one third of the maximum or minimum extension of an envelope of the projection arrangement transverse to the optical axis.

15. The projection arrangement in accordance with claim 1, further comprising at least one further stray light stop.

16. The projection arrangement in accordance with claim 15, wherein the at least one further stray light stop can be moved together with the combination stop by a device for moving the combination stop.

17. The projection arrangement in accordance with claim 15, wherein the at least one further stray light stop is arranged in at least one location selected from the group consisting of a field plane, the vicinity of the field plane, an intermediate image plane, and the vicinity of the intermediate image plane.

18. The projection arrangement in accordance with claim 15, wherein the combination stop and the at least one further stray light stop are joined together in at least one way selected from the group consisting of a physical connection, a rigid connection and an articulated connection.

19. The projection arrangement in accordance with claim 1, wherein the first opening has at least one element selected from the group consisting of obscuration mechanisms, optically operative elements, apodisation filters, phase filters and polarisation filters.

20. The projection arrangement in accordance with claim 19, wherein the first opening has obscuration mechanisms including rings and/or discs.

21. The projection arrangement in accordance with claim 1, wherein the combination stop is part of a vacuum housing.

22. The projection arrangement in accordance with claim 1, wherein the projection arrangement is catoptric.

23. The projection arrangement in accordance with claim 1, wherein the projection arrangement comprises six mirrors.

24. The projection arrangement in accordance with claim 1, wherein an optical axis of the projection arrangement is defined by a connecting line between curvature mid-points of the reflective elements.

25. The projection arrangement in accordance with claim 1, wherein the meridional plane contains the principal beam through the center of the first opening and an optical axis of the projection arrangement.

26. A projection arrangement configured to image an object field in an object plane onto an image field in an image plane along a ray path, the projection arrangement comprising:
   at least one reflective element; and
   a combination stop in a pupil plane of the ray path, the combination stop comprising a plurality of stop units, each stop unit having first and second openings, the first opening of each stop unit being configured as an aperture stop, the second opening of each stop unit being configured to allow passage of a ray bundle of the ray path so that the combination stop is an aperture stop and a stray light stop,
   wherein for each of the stop units of the projection arrangement:
      a cross-sectional shape of the first opening has a center of gravity in a plane; and
      a cross-sectional shape of the second opening has a center of gravity in the plane;
   wherein the centers of gravity of the cross-sectional shapes of all of the first and second openings of all of the stop units of the projection arrangement are in a straight line, and
   wherein the projection arrangement is a microlithography projection arrangement.

27. The projection arrangement in accordance with claim 26, wherein a width of the combination stop transverse to a direction of the line is less than 1.5 times a diameter of a largest first opening of the combination stop or a maximum linear dimension of any of the second openings of the combination stop.

28. The projection arrangement in accordance with claim 26, wherein a length of the combination stop parallel to a direction of the line is 1.5 times a sum of the diameters of the first openings of the combination stop and a maximum linear dimension of any of the second openings parallel to the direction of the line.

29. A projection arrangement configured to image an object field of an object plane onto an image field of an image plane along a ray path, the projection arrangement comprising:
   at least one reflective element: and
   a combination stop in a pupil plane of the ray path, the combination stop comprising a plurality of stop units, each stop unit having first and second openings, the first opening of each stop unit being configured to be used as an aperture stop, the second opening of each stop unit being configured to allow passage of a ray bundle of the ray path so that the combination stop is an aperture stop and a stray light stop,
   wherein for each of the stop units of the projection arrangement:
      a cross-sectional shape of the first opening has a center of gravity in a plane;
      a cross-sectional shape of the second opening has a center of gravity in the plane;
   wherein the centers of gravity of the cross-sectional shapes of all the first openings of all the stop units of the projection arrangement are in a first straight line; and
      the centers of gravity of the cross-sectional shapes of all the second openings of all the stop units of the projection arrangement are in a second straight line;
      the first straight line is different from the second straight line; and
   wherein the projection arrangement is a microlithography projection arrangement.

30. A projection arrangement configured to image an object field in an object plane onto an image field in an image plane along a ray path, the projection arrangement comprising:
   first, second, and third reflective elements;
   a plurality of combination stops in a pupil plane of the ray path, each of the combination stops having first, second, and third openings, the first opening in each of the combination stop being configured to be an aperture stop, the second opening in each of the combination stop being configured to allow passage of a ray bundle of the ray path so that each of the combination stop is an aperture stop and a stray light stop;
   a reticle; and
   a magazine configured to hold a plurality of combination stops, each combination stop having different sized openings,
   wherein:
      the plurality of combination stops comprises a first combination stop;
      the first combination stop is between the reticle and the first reflective element;
      the first combination stop is between the first reflective element and the second reflective element;

the first opening in the first combination stop is configured to allow passage of the ray bundle from the first reflective element to the second reflective element;

the second opening in the first combination stop is configured to allow passage of the ray bundle between the reticle and first reflective element;

the third opening in the first combination stop is configured to allow passage of the ray bundle from the second reflective element to the third reflective element; and the projection arrangement is a microlithography projection arrangement.

31. The projection arrangement in accordance with claim 30, wherein in the case of a smaller first opening, the second and third opening or each further opening are also smaller and vice versa.

32. The projection arrangement in accordance with claim 30, wherein in the case of a smaller or larger first opening, second or third openings are equal.

33. The projection arrangement in accordance with claim 30, further comprising a device configured to move the combination stop out of the ray path.

34. The projection arrangement in accordance with claim 33, wherein the device can be moved at least partly in the direction of the ray path.

35. The projection arrangement in accordance with claim 33, wherein the device comprises a magazine to store several combination stops, and the device comprises an exchange mechanism to exchange combination stops.

\* \* \* \* \*

UNITED STATES PATENT AND TRADEMARK OFFICE
CERTIFICATE OF CORRECTION

PATENT NO. : 8,208,127 B2
APPLICATION NO. : 12/173595
DATED : June 26, 2012
INVENTOR(S) : Hans-Juergen Mann It is certified that error appears in the above-identified patent and that said Letters Patent is hereby corrected as shown below:

Column 10, line 64, Claim 13, delete "swileing" insert --swivelling--.

Signed and Sealed this
Fourteenth Day of August, 2012

David J. Kappos
*Director of the United States Patent and Trademark Office*